(12) United States Patent
Kuo

(10) Patent No.: US 7,102,372 B2
(45) Date of Patent: Sep. 5, 2006

(54) APPARATUS AND METHOD FOR TESTING CONDUCTIVE BUMPS

(75) Inventor: Yian-Liang Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/979,418

(22) Filed: Nov. 2, 2004

(65) Prior Publication Data
US 2006/0103399 A1    May 18, 2006

(51) Int. Cl.
*G01R 31/02* (2006.01)
(52) U.S. Cl. ....................................... 324/755
(58) Field of Classification Search .............. None
See application file for complete search history.

(56) References Cited

U.S. PATENT DOCUMENTS

| 5,416,429 | A | * | 5/1995 | McQuade et al. .......... 324/762 |
| 5,784,262 | A | * | 7/1998 | Sherman ...................... 361/777 |
| 6,075,710 | A | * | 6/2000 | Lau ............................. 361/760 |
| 6,218,848 | B1 | * | 4/2001 | Hembree et al. ........... 324/754 |
| 6,366,106 | B1 | * | 4/2002 | Kimori et al. .............. 324/757 |
| 6,564,986 | B1 | * | 5/2003 | Hsieh .......................... 228/103 |
| 6,788,092 | B1 | * | 9/2004 | Cheng et al. ............... 324/765 |
| 6,894,524 | B1 | * | 5/2005 | Grilletto ..................... 324/765 |
| 6,911,834 | B1 | * | 6/2005 | Mitchell et al. ............ 324/754 |
| 2003/0141883 | A1 | | 7/2003 | Mitchell et al. ............ 324/754 |

* cited by examiner

*Primary Examiner*—Vinh Nguyen
*Assistant Examiner*—Richard Isla-Rodas
(74) *Attorney, Agent, or Firm*—Thomas, Kayden, Horstemeyer & Risley

(57) ABSTRACT

Apparatus and method for testing conductive bumps. The apparatus for testing a plurality of conductive bumps with a single electrical pathway comprises a support substrate and a first probe, a second probe and a plurality of dual-probe sets respectively disposed in the support substrate, wherein each of the dual-probe sets comprises two electrically connected third probes.

19 Claims, 9 Drawing Sheets

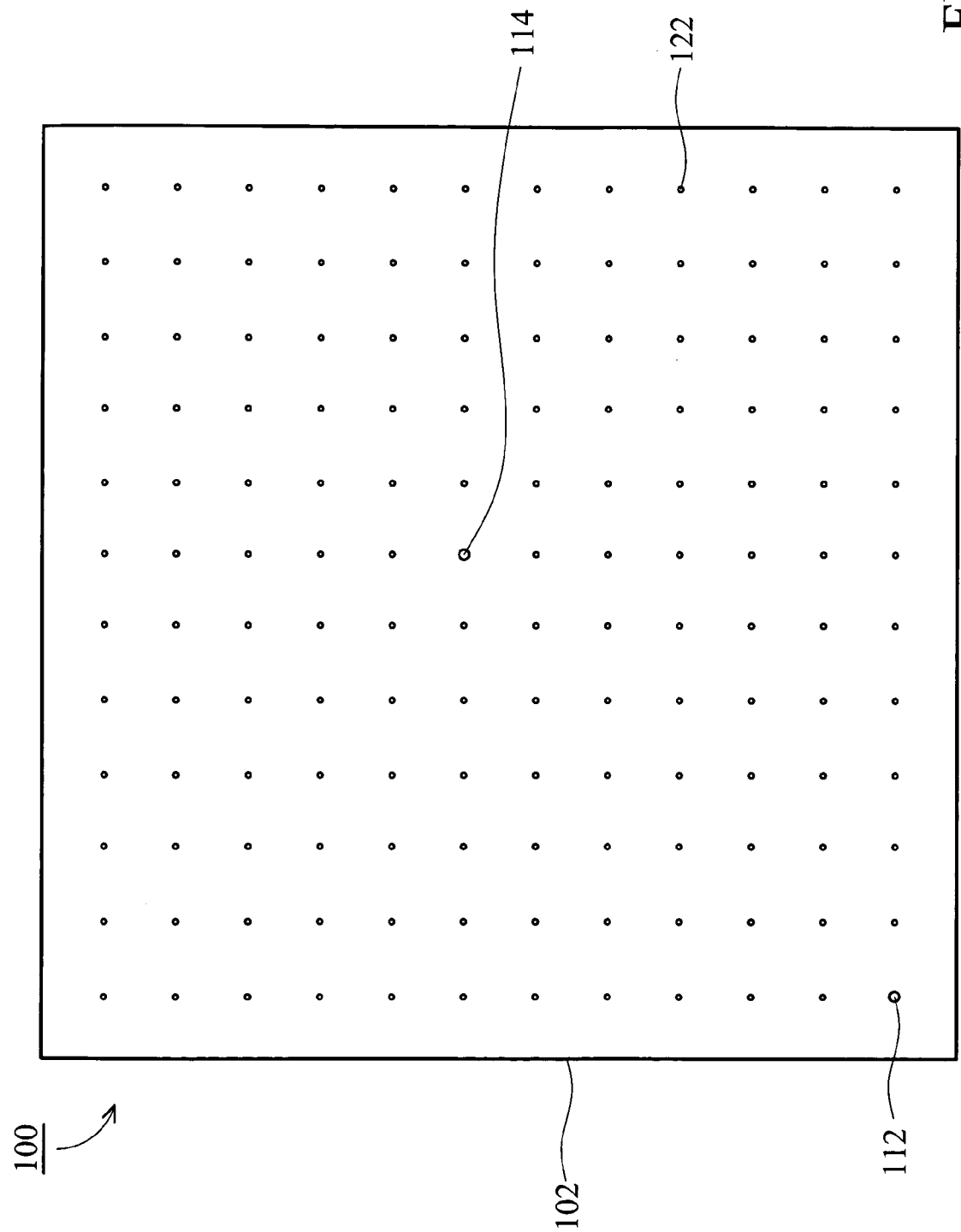

APPARATUS AND METHOD FOR TESTING CONDUCTIVE BUMPS

BACKGROUND

The present invention relates to a testing apparatus for bumps at wafer level and a testing method thereof. Particularly, the present invention relates to an apparatus for testing conductive bumps formed on semiconductor components and the testing method thereof.

A flip chip microelectronic assembly includes direct electrical connection of face down, or "flipped", electronic components to substrates, such as ceramic substrates, circuit boards, or carriers using conductive bump bonding pads. Flip chip technology is quickly replacing older wire bonding technology that uses face up chips with wire connected to each pad on the chip.

Flip chips are typically made by a process including placing solder bumps on a silicon wafer. The solder bump flip chip processing typically includes four sequential steps of preparing the wafer for solder bumping, forming or placing the solder bumps on the wafer, attaching the solder bumped die to a board, substrate or carrier, and completing the assembly with an adhesive underfill.

The bumps of the flip chip assembly also serve several functions. The bumps provide an electrical conductive path from the chip (or die) to the substrate on which the chip is mounted. A thermally conductive path is also provided by the bumps to carry heat form the chip to the substrate. The bumps also facilitate mechanical mounting of the chip to the substrate.

A few widely used methods of depositing bumps are evaporation, electroplating, electroless plating, sputtering and stencil-printing. The quality of the bumps formed on the semiconductor component, however, is a factor affecting reliability of the semiconductor chip after the flip-chip assembly. Poor bump formation may prevent the semiconductor chip from passing tests, especially the reliability tests.

Currently, however bumps formed on a semiconductor component by one of the described methods can only be tested after the flip-chip assembly of the semiconductor component is completed.

FIGS. 1 and 2 illustrate a conventional "daisy-chain" method testing method, for determining quality of conductive bumps. In FIG. 1, the daisy-chain method is achieved by first forming a bump array having a plurality of bumps 12 over a test die 10 of a semiconductor substrate (not shown) by any of the previously described bump forming methods. Every two bumps 12 are electrically connected by a segment 14 formed on the surface of the test die 10 to form a bump section 16. Each segment 14 is electrically conductive and a plurality of bump sections 16 can thus be formed over the test die 10 and each thereof is electrically separated. Further, second segment 18 can be formed over the test die 10 to properly connect two bump segments 16 for the purpose of line routing. The segment 14 and the second segment 18 can be a short metal segment or a bonding pad formed on the surface of the test die 10, the material thereof can be an electrically conductive material such as aluminum or aluminum alloy.

As shown in FIG. 2, the test die 10 having a plurality of bump sections 16 in FIG. 1 is then assembled on a test board 20 having a plurality of third segments 22 and solder balls 24 formed thereon. The third segment 22 and the solder balls 24 are also electrically conductive. Each bump section 16 on the test die 10 is disposed over a position complementary to an pair of adjacent third segments 22 thereof and thus a single electrically conductive path (not shown) can be formed after the assembly of the test die 10. The test board 20 and a test such as an impedance test for the bumps 12 can then be performed by a testing apparatus such as a burn-in socket to examine not only the quality of bumps but also the conditions of the bumping process. The conventional daisy-chain method, however, labor intensive and time consuming. Further, the daisy-chain method cannot be applied to the testing of product dies in modern IC industries and is used only when evaluating a bumping process and process parameters thereof.

Hence, there is a need for an apparatus for instantaneously testing conductive bumps. In U.S. patent application publication US2003/0141883, Mitchell et. al. provide a probe card testing apparatus which includes a pair of side by side and parallel probes for contacting a single conductive ball or contact point for the purpose and benefit of correcting contaminant layer IR voltage drops using Kelvin techniques.

SUMMARY

Accordingly, an object of the invention is to provide an apparatus for instantaneously testing a plurality conductive bumps formed on a semiconductor component using a single conductive path formed therebetween. The apparatus for testing a plurality of conductive bumps comprises a support substrate and a first probe, a second probe and a plurality of dual-probe sets respectively disposed in the support substrate, wherein each of the dual-probe sets comprises two electrically connected third probes.

Another object of the invention is to provide a method for testing a plurality of conductive bumps immediately after formation thereof. The method for testing a plurality of conductive bumps comprises the steps of providing a substrate with a region having a plurality of bumps, wherein every two bumps are electrically connected to form a plurality of bump-sections on the substrate. A support plate having a first probe, a second probe and a plurality of dual-probe sets is then provided, wherein the dual-probe sets are disposed in a position complementary to the position of the bump sections. Next, the support plate electrically contacts the substrate to connect the bumps with the first probe, the second probe and the dual-probe sets, forming a single conductive pathway. A detector having a power supply therein is then coupled to the first probe and the second probe to provide a predetermined voltage to the single conductive pathway for testing the bumps.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

Figure 1:
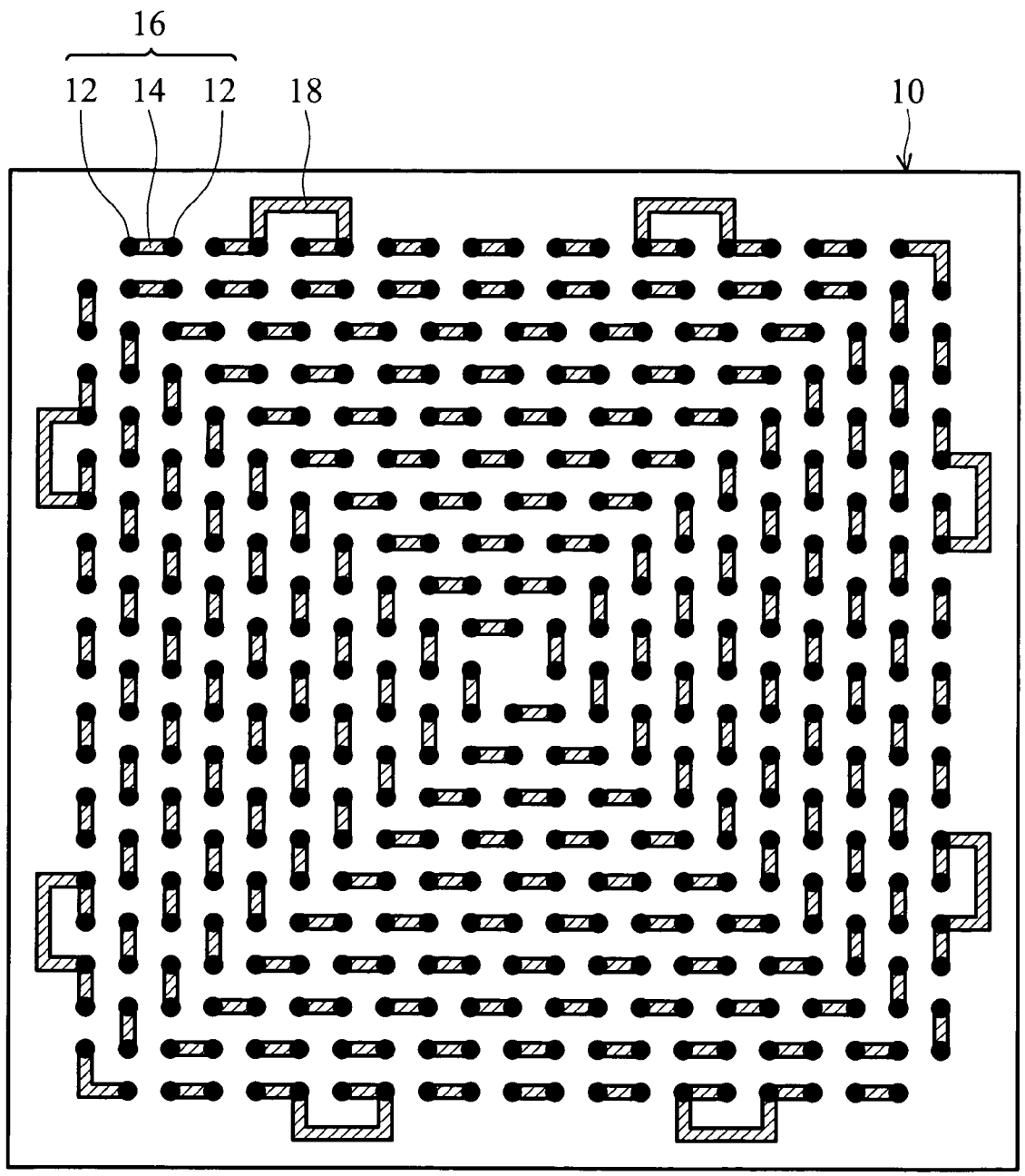
FIGS. 1 to 2 are schematic diagrams of a conventional method for testing conductive bumps.
Figure 2:
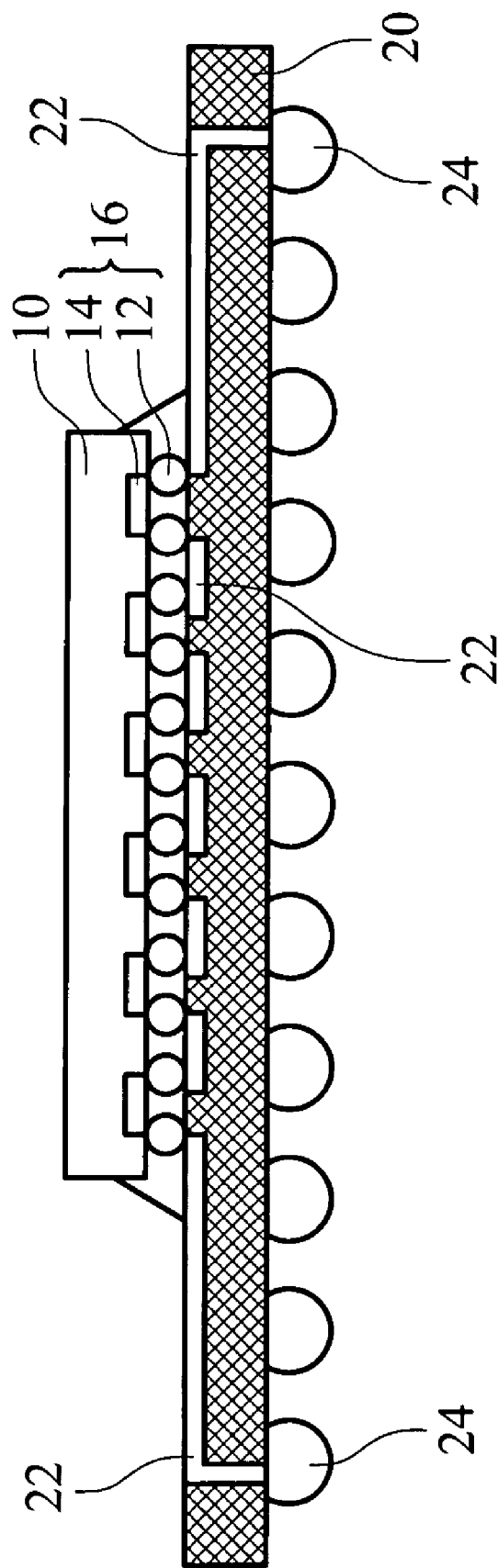
Figure 3:
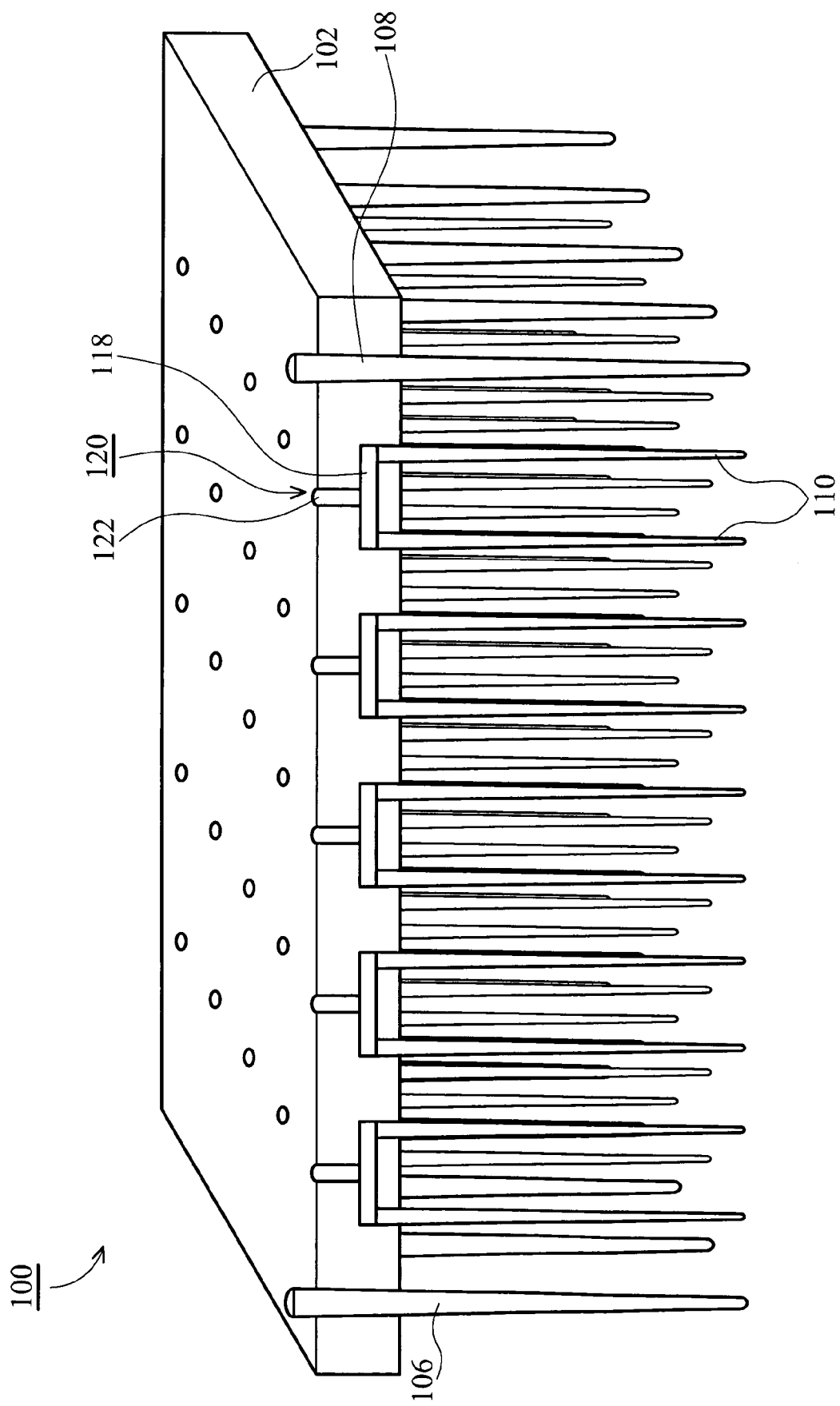
FIGS. 3 to 6 are schematic diagrams showing an apparatus for testing conductive bumps according to one embodiment of the invention.

FIGS. 3 to 6 are schematic views showing an apparatus for testing conductive bumps according to one embodiment of the invention. In FIG. 3, an apparatus 100 for testing conductive bumps is illustrated. The apparatus 100 includes a support substrate 102 having a plurality of test probes formed therein. The support substrate 102 can comprise insulating material, such as ceramic, epoxy, resin, polyimide, FR4 or polymer. The test probes include a first probe 106, a second probe 108 and one or more dual-probe sets 120 arranged in such a manner as to form a single conductive path during bump tests. The first probe 106 and the second probe 108 protrude over the upper surface of the support substrate 102 to respectively expose a protrusion 112, 114 thereof. Each of the dual-probe set disposed in the support substrate 102 comprises two third probes 110 which connected by a first conductive segment 118 formed in the support plate 102. The first conductive segment 118 can be a short metal segment and contact holes 122 can be disposed over several or all of the dual-probe sets 120 to expose a portion of the first conductive segment 118, serving as an additional test point for detecting malfunctioning or inoperative bumps in a bump array.

Figure 4A:
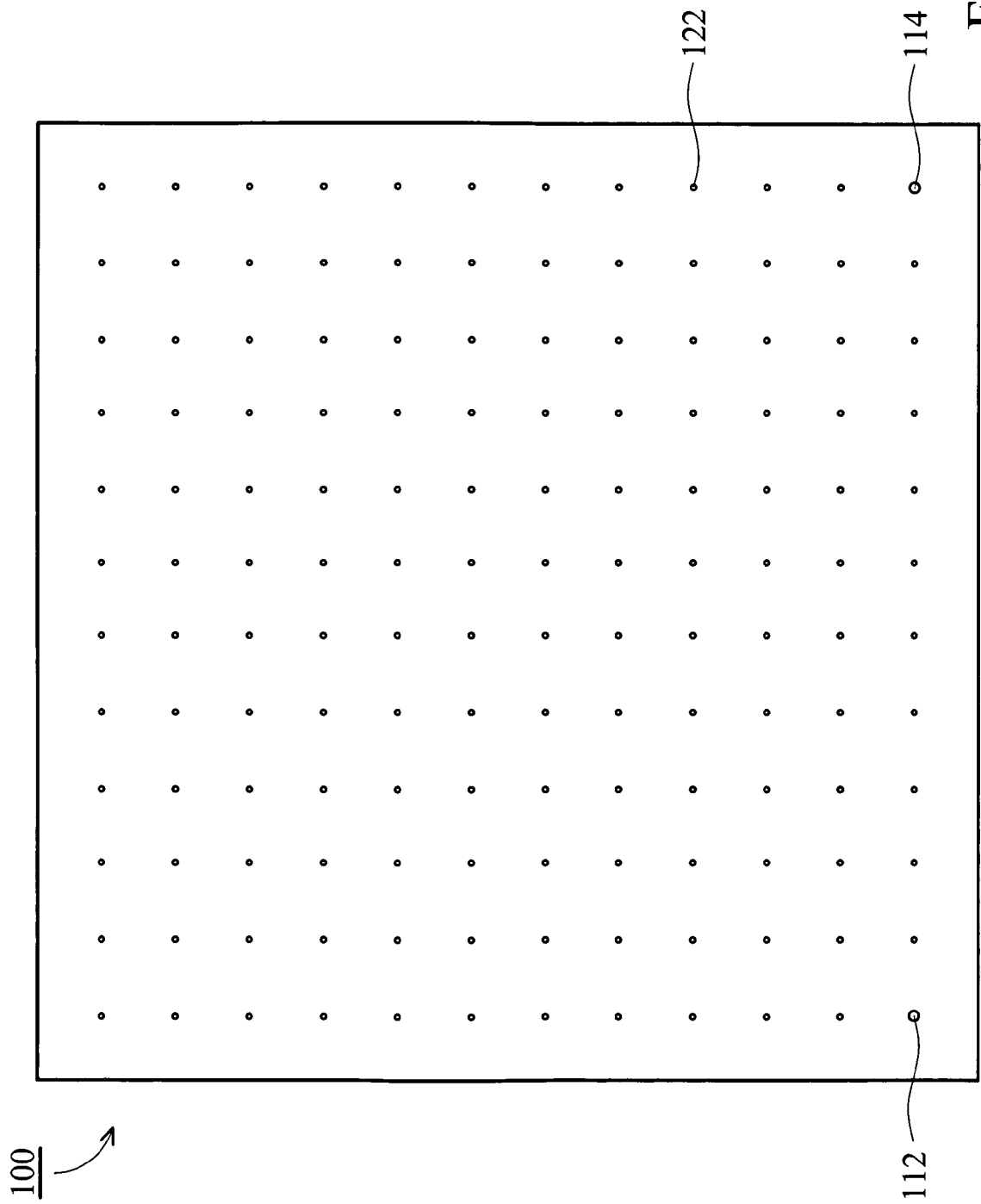
Figure 4B:
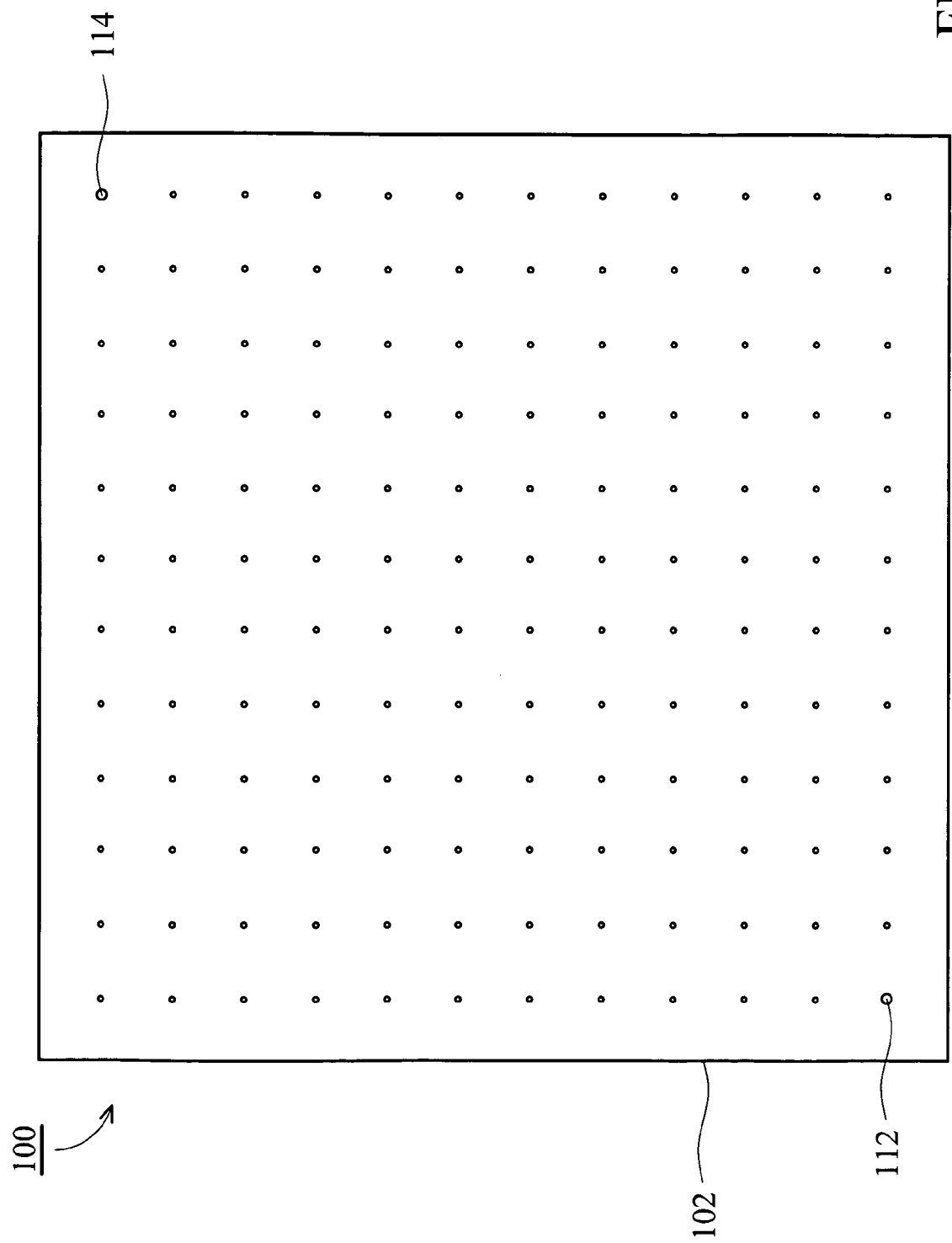

FIGS. 4A–4C are top views showing possible probe arrangement in the apparatus 100 according to one embodiment of the invention. Typically but not necessarily, the first probe 106 and the second probe 108 are disposed in the farthest two ends of the support substrate 102. One or more dual-probe sets 120 (not shown) are disposed in the support substrate 102 and respectively expose the contact hole 122 thereof. FIGS. 4B and 4C respectively show possible arrangements of probes in the support substrate 102. In FIG. 4B, the first probe and the second probe are orthogonally disposed in the support substrate 102, and one of the first and the second probes can be also disposed in the center of the support substrate 102, as shown in FIG. 4C.

Figure 5:
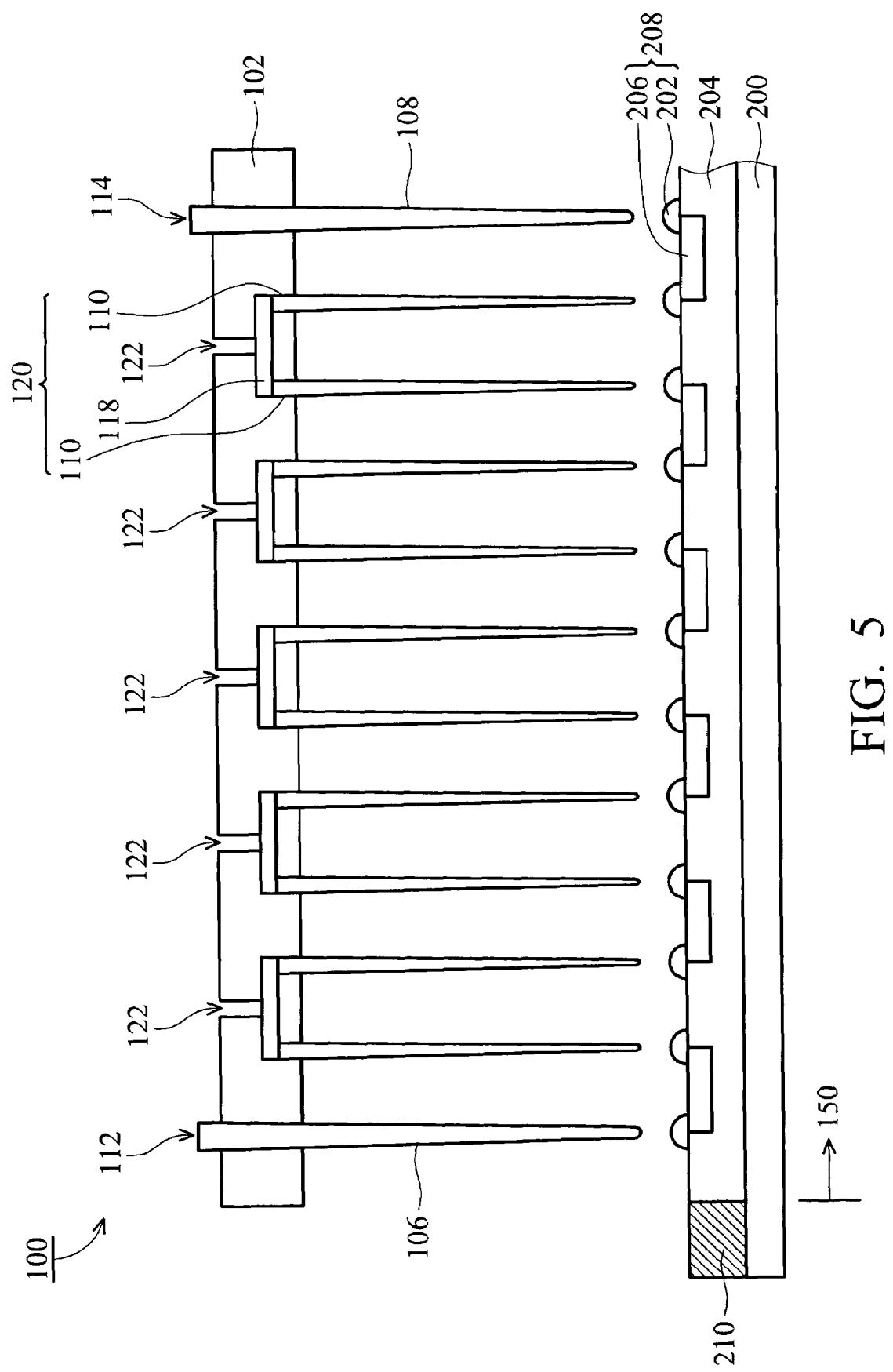

In FIG. 5, shows a cross section of the apparatus 100 corresponding to a test region 150 formed over a semiconductor substrate 200. Wherein, the first probe 106 and the second probe 108 of the apparatus 100 are disposed at the farthest two ends of the plate 102 and a plurality of dual-probe sets 120 are disposed therebetween. The probes arrangement depicted in figure, however, is not intended to be limitative, and the installation shown in FIG. 5 can be properly modified by those skilled in the art according to the relative bump arrangement.

As shown in FIG. 5, a plurality of bumps 202 are formed on the surface of an insulating layer 204 overlying a semiconductor substrate 200. The apparatus 100 is disposed over a test region 150 having a bump array comprising a plurality of bumps 202 formed thereon for the purpose of performing a bump test. The test region 150 can be a periphery region of a product die or a test die formed on a semiconductor substrate 200, divided by a dummy region 210. Bumps 202 can be formed by methods such as evaporation, electroplating, electroless plating, sputtering or stencil-printing. In FIG. 5, every two bumps 202 are respectively connected by a second conductive segment 206 formed in the insulating layer 204, thus forming a plurality of bump sections 208 in the test region 150. The bump sections 208 are electrically independent and respectively spaced by the insulating layer 204. Here, the second conductive segment 206 can be a short metal segment or a conductive bonding pad of conductive material such as aluminum or aluminum alloy. The probes 106, 108 and 110 of the invention can be tungsten rhenium (WRe) needles, tungsten (W) needles, Beryllium-Copper (BeCu) needles or Peliney® needles.

Figure 6:
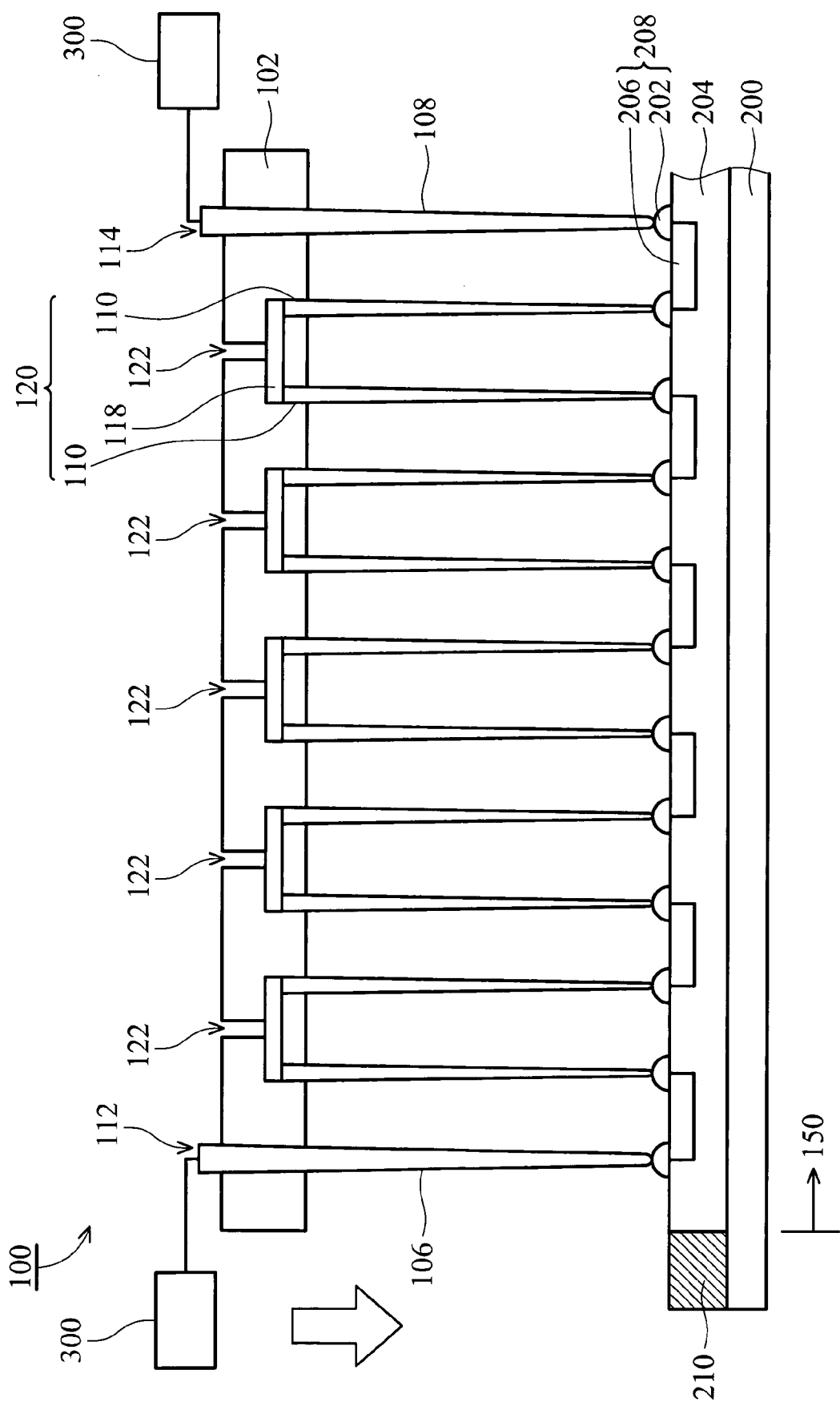

FIG. 6 shows a cross section showing positions of the apparatus 100 and a test region 150 during a bump test according to a preferred embodiment the invention. During the bump test, the apparatus 100 is moved toward the semiconductor 200 by a handler (not shown) such that all the probes simultaneously contact all the bumps 202 in the test region 150, wherein each probe of the dual-probe set 120 contacts one bump of two adjacent bump sections 208 by contact. Typically but not necessarily, the first probe 106 and the second probe 108 contact the two bumps at the farthest two ends, thus forming a single electrical conductive pathway. Next, a detector 300 containing a power supply (not shown) is provided to couple the protrusions 112 and 114 over the support plate 102, thus providing a predetermined voltage to the conductive pathway. Tests at the wafer level such as the impedance test, defect site diagnosis, defect distribution analysis and the like for evaluating conductive bumps 202 can thus be performed immediately after bump formation. If the electrically conductive pathway achieves an acceptable result that meets the specification of the wafer level test, bump quality or bumping process condition are ensured. If the electrically conductive pathway shows an unacceptable result, the bumping process may be suspended for inspection of the formed bumps over the test die or the product die through electrically contacting the detector 300 with the first probe 106, the second probe 108, and the dual-probe set 120 exposed by each contact hole 122, for locating malfunctioning or inoperative bumps, defect site diagnosis or defect distribution analysis.

Figure 7:
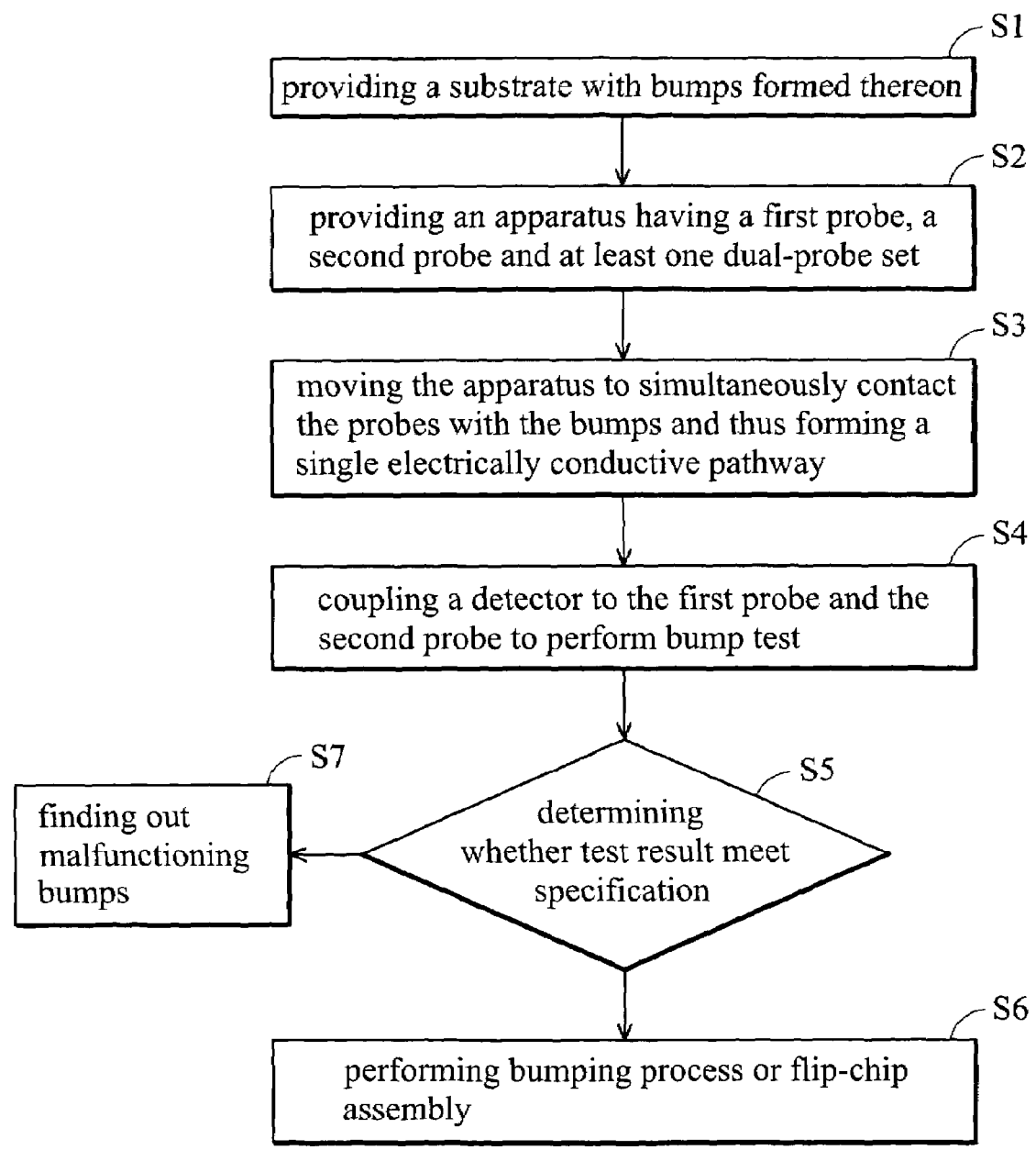
FIG. 7 is a flow chart showing a method for testing conductive bumps according to one embodiment of the invention.

FIG. 7 is a flow chart showing a method for testing conductive bumps according to an embodiment of the invention. In step S1, a substrate such as a semiconductor wafer or a semiconductor die having bumps formed thereon is provided. The bumps can be formed in an array arranged in a predetermined manner and every two bumps are respectively connected by an electrically conductive segment, forming bump sections. In step S2, an apparatus having a first probe, a second probe and at least one dual-probe set is provided. The probes are respectively disposed in a position relative to the position of each bump sections over the substrate. In step S3, the probes of the apparatus simultaneously contact all the bumps. Thus, a single electrical conductive pathway is formed. In step S4, a detector having a power supply therein is coupled to the first probe and the second probe and provides a predetermined voltage to the pathway for testing for the bumps. Step S5 determines whether the obtained test result, for example an impendance measurement, meets the process specification thereof. If yes, a bumping process for bump formation or bumps formed over a product die in a semiconductor substrate passes the wafer level test. The bumping process or sequential flip-chip assembly to the substrate can then be continuously performed, as shown in step S6. If not, product die may comprise nonfunctioning bumps or the bumping process may not have passed the test. Regions with malfunctioning bumps can be detected through an additional bump test by applying the bump test method of the invention to the contact hole formed on each dual-probe set, serving as one test point, and the first probe or second probe serves as the other test point, as shown in step S7.

The apparatus of the invention includes two single probes and one or more dual-probe sets formed in an insulating plate and is distinct from the apparatus disclosed in U.S. Pat. Application publication US 2003/0141883, having a pair of side by side and parallel probes for contacting a single conductive ball or contact point for the purpose and benefit of correcting contaminant layer IR volatage drops using Kelvin techniques. The probes of the invention are arranged in a complementary positions relative to the bumps formed on a semiconductor substrate and examine the bumps by a single electrical pathway formed therebetween. The single electrical pathway can be applied to any wafer level test, wherein the test result thereof reveals performance of the formed bumps.

The prevent invention provides a novel testing apparatus for testing conductive bumps and a test method thereof. The apparatus and the method of the invention enable examination of bump quality and a bumping process immediately subsequent to bump formation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for testing a plurality of conductive bumps with a single electrical pathway, comprising:
    a support substrate; and
    a first probe, a second probe and a plurality of dual-probe sets respectively disposed in the support substrate, wherein each of the dual-probe sets comprises two third probes electrically connected by a conductive segment.

2. The apparatus as claimed in claim 1, wherein the support substrate comprises ceramic, epoxy, resin, polyimide, FR4 or polymer.

3. The apparatus as claimed in claim 1, wherein the first probe and the second probe comprise tungsten rhenium (WRe), tungsten (W), Beryllium-Copper (BeCu) or Peliney®.

4. The apparatus as claimed in claim 1, wherein the third probe comprises tungsten rhenium (WRe), tungsten (W), Beryllium-Copper (BeCu) or Peliney®.

5. The apparatus as claimed in claim 1, wherein the conductive segment is a metal segment or a bonding pad.

6. The apparatus as claimed in claim 1, further comprising a contact hole disposed on a second conductive segment of each dual-probe set.

7. An apparatus for testing a plurality of conductive bumps with a single electrical pathway, comprising:
    a support substrate;
    a first probe, a second probe and a plurality of dual-probe sets respectively disposed in the support substrate, wherein each of the dual-probe sets comprises two third probes electrically connected by a conductive segment, and the first probe and the second probe protrude from the upper surface of the support substrate to expose a protrusion thereof; and
    a detector coupled to the protrusions of the first probe and the second probe for testing the bumps.

8. The apparatus as claimed in claim 7, wherein the support substrate comprises ceramic, epoxy, resin, polyimide, FR4 or polymer.

9. The apparatus as claimed in claim 7, wherein the first probe and the second probe comprise tungsten rhenium (WRe), tungsten (W), Beryllium-Copper (BeCu) or Peliney®.

10. The apparatus as claimed in claim 7, wherein the third probe comprises tungsten rhenium (WRe), tungsten (W), Beryllium-Copper (BeCu) or Peliney®.

11. The apparatus as claimed in claim 7, wherein the conductive segment is a metal segment or a bonding pad.

12. The apparatus as claimed in claim 7, further comprising a contact hole disposed over the second conductive segment of the dual-probe set.

13. A method for testing conductive bumps with a single electrical pathway, comprising the steps of:
    providing a substrate with a region having a plurality of bumps, wherein every two bumps are electrically connected to form a plurality of bump-sections on the substrate;
    providing a test plate having a first probe, a second probe and a plurality of dual-probe sets comprising two third probes connected by a conductive segment, wherein the dual-probe sets are disposed in a complementary position to the bump sections;
    contacting the test plate with the substrate to connect the bumps with the first probe, the second probe and the dual-probe sets, forming a single conductive pathway; and
    coupling a detector having a power supply therein to the first probe and the second probe to provide a predetermined voltage to the single conductive pathway for testing the bumps.

14. The method as claimed in claim 13, wherein the test plate comprises ceramic, epoxy, resin, polyimide, FR4 or polymer.

15. The method as claimed in claim 13, wherein the the first probe and the second probe comprises tungsten rhenium (WRe), tungsten (W), Beryllium-Copper (BeCu) or Peliney®.

16. The method as claimed in claim 13, wherein the conductive segment is a metal segment or a bonding pad.

17. The method as claimed in claim 13, wherein the region is a peripheral region or an active region.

18. The method as claimed in claim 13, wherein the single conductive pathway examines connectivity between the bumps and reveals performance of the bumps.

19. The method as claimed in claim 13, wherein the single conductive pathway performs an impedance test.

* * * * *